US007324035B2

(12) United States Patent
Harris et al.

(10) Patent No.: US 7,324,035 B2
(45) Date of Patent: *Jan. 29, 2008

(54) AMPLIFIER WITH PULSE CODED OUTPUT AND REMOTE SIGNAL RECONSTRUCTION FROM THE PULSE OUTPUT

(75) Inventors: John G. Harris, Gainesville, FL (US); Du Chen, Gainesville, FL (US); Dazhi Wei, Gainesville, FL (US); Jose C. Principe, Gainesville, FL (US)

(73) Assignee: University of Florida Research Foundation, Inc., Gainesville, FL (US)

( * ) Notice: Subject to any disclaimer, the term of this patent is extended or adjusted under 35 U.S.C. 154(b) by 373 days.

This patent is subject to a terminal disclaimer.

(21) Appl. No.: 10/844,950

(22) Filed: May 13, 2004

(65) Prior Publication Data

US 2007/0273411 A1    Nov. 29, 2007

(51) Int. Cl.
*H03M 1/12* (2006.01)
*A61B 5/0476* (2006.01)

(52) U.S. Cl. ............... 341/155; 600/544; 341/157; 341/166

(58) Field of Classification Search .. 250/370.1–370.5; 323/222, 223, 207, 226, 273, 274, 282; 363/20, 363/21, 89, 97, 101; 600/407–476, 544; 341/155, 157, 166
See application file for complete search history.

(56) References Cited

U.S. PATENT DOCUMENTS

| | | | | |
|---|---|---|---|---|
| 3,918,050 A | * | 11/1975 | Dorsman | ............ 341/158 |
| 4,727,256 A | * | 2/1988 | Kumazawa | ............ 250/370.1 |
| 4,746,900 A | | 5/1988 | Shibuya et al. | |
| 4,807,147 A | * | 2/1989 | Halbert et al. | ............ 702/66 |
| 5,692,511 A | * | 12/1997 | Grable | ............ 600/425 |
| 5,742,151 A | * | 4/1998 | Hwang | ............ 323/222 |
| 6,833,803 B2 | * | 12/2004 | Mayfield | ............ 341/155 |

OTHER PUBLICATIONS

Ji et al., "An Implantable CMOS Circuit Interface for Multiplexed Microelectrode Recording Arrays," IEEE J. of Solid-State Circuits, vol. 27, No. 3 (Mar. 1992).
Najafi et al., "An Implantable Multielectrode Array with On-Chip Signal Processing," IEEE J. of Solid-State Circuits, vol. SC-21, No. 6 (Dec. 1986).
Lazar et al., "Time Encoding and Perfect Recovery of Bandlimited Signals," Proc. ICASSP, Hong Kong (2003).

(Continued)

*Primary Examiner*—Carl Layno
(74) *Attorney, Agent, or Firm*—Akerman Senterfitt

(57) ABSTRACT

An amplifier-based system having pulsed output includes an amplifier for amplifying a time varying voltage signal to produce an output voltage signal. A voltage-to-current (V-I) converter converts the output voltage signal into a current signal. An output stage including a current integrator integrates the current signal to generate an integrated voltage. An amplitude to time converter generates a pulse train from the integrated voltage, wherein a timing of the pulses in the pulse train represents the original time varying voltage signal. The pulse train representation permits transmission and accurate remote reconstruction of the original time varying voltage signal, such as signals generated by electrodes implanted inside a subject, including neural signals.

14 Claims, 13 Drawing Sheets

OTHER PUBLICATIONS

Steyaert et al., "A Micropower Low-Noise Monolithic Instrumentation Amplifier for Medical Purposes," IEEE J. of Solid-State Circuits, vol. SC-22, No. 6 (Dec. 1987).

Harrison et al., "A Low-Power Low-Noise CMOS Amplifier for Neural Recording Applications," IEEE J. of Solid-State Circuits, vol. 38, No. 6 (Jun. 2003).

* cited by examiner

AMPLIFIER WITH PULSE CODED OUTPUT AND REMOTE SIGNAL RECONSTRUCTION FROM THE PULSE OUTPUT

STATEMENT REGARDING FEDERALLY SPONSORED RESEARCH OR DEVELOPMENT

The Government has certain rights to the invention based on Defense Advanced Research Program Agency (DARPA) project No. N66001-02-C8022 and National Science Foundation Award No. EIA-0135946.

CROSS-REFERENCE TO RELATED APPLICATIONS

Not applicable.

FIELD OF THE INVENTION

The invention related to amplifiers, more particularly to low power, low noise amplifiers and sensors which include integrated analog and digital conversion circuitry.

BACKGROUND

With the advent of distributed sensing in environmental monitoring, process control and in clinical applications, small, low voltage/power, low noise, and inexpensive amplifiers have begun having increasing importance. For example, certain applications require amplification of sensor signals on the order of microvolts, or even nanovolts.

Another challenge is that real world signals are analog, but current technology is becoming more and more digitally based. This raises the need of translating the analog signals to digital representations through analog to digital converters (ADCs). ADCs are expensive to build and generally do not conform with the requirements for distributed sensing of low cost, low power, and low noise.

For example, for brain-related applications such as brain machine interfaces (BMIs), the processing of small signals requires a circuit with ultra low power consumption and a small layout. Low power is needed because BMIs will generally be battery powered, while the application dictates the size of the device. With the advent of dense electrode arrays for neuron recording, interest in many such brain-related applications has greatly increased. For BMI applications, implanted electrodes in multiple cortical and sub-cortical regions are currently being used to investigate the correlation between neuron population activity and associated subject behavior in monkeys.

Ultimately, hundreds or thousands of simultaneous neural signals recorded from paraplegic humans will likely be used to control computer cursors or robot arms. Since the hardware for recording the neural signals must be located close to the implanted electrodes, the devices must be as small and lightweight as possible, particularly if many densely packed channels are to be recorded. One of the solutions to this problem is to use analog circuits to acquire and process the electrical signals transduced from implanted extracellular cortical electrodes.

Neural recordings are typically made using multiple electrodes inserted into the brain via a small craniotomy. A wire attached to a screw implanted in the skull provides a neural reference voltage. The extracellular neural signals typically have amplitudes of about 10-100 μV, and typical electrode impedances are around 100 kΩ at 1 kHz. Due to the unavoidable electrochemical effects at the electrode-tissue interface, DC offsets typically ranging from 1 to 2V generally arise across the recording electrodes. The frequencies of the brain waves of interest range from 100-400 Hz to 3 k-11 kHz, while the Local Field Potentials (LFP) extend below 1 Hz. Thus, an optimal bandpass filter for neural recording must reject the DC offset while passing the LFP signal.

The processing and transmission of the neural data poses another challenge. The most common solution currently employed is to amplify, multiplex and transmit analog intracortcical neural activity with on-chip CMOS analog circuitry, while using leads for power supply and data transfer. However, these interconnection wires can potentially cause infection in chronic implants at the points where they break the skin. On-chip analog-digital conversion is required to enhance the signal-to-noise ratio and robustness, as well as to provide a wireless transmission interface to reduce the risk of infection for chronic recording.

Conventional sigma-delta ADCs are one class of ADC. However, sigma-delta converters use oversampling techniques and complex digital circuitry at high sampling rates which consumes a large amount of power. For example, the power consumption is about 150 mW for the AD7721 from Analog Devices (Analog Devices, Norwood, Mass.) which is a CMOS 16 bit 468 kHz sigma-delta ADC. Sigma-delta ADC power consumption from other vendors are also at similar levels. Thus, lower power, lower noise, and small size integrated amplifiers which provide digital outputs are clearly needed for a variety of applications, particularly those involving low signal levels.

SUMMARY OF THE INVENTION

An amplifier-based system having pulsed output includes an amplifier for amplifying a time varying voltage signal to produce an output voltage signal. A voltage-to-current (V-I) converter converts the output voltage signal into a current signal. An output stage including a current integrator integrates the current signal to generate an integrated voltage. An amplitude to time converter generates a pulse train from the integrated voltage, where the timing of the pulses in the pulse train includes information representative of the original time varying voltage signal. The pulse train representation permits transmission and accurate remote reconstruction of the original time varying voltage signal, such as signals generated by electrodes implanted inside a subject, including neural signals.

Each pulse of the pulse train can be initiated when the integrated voltage reaches a predetermined voltage. In one embodiment, the (V-I) converter consists essentially of a fixed resistor.

The amplifier can be a closed loop operational amplifier having an input stage including an inverting input and a non-inverting input. In this embodiment, at least one diode can be connected between an output of the operational amplifier and the inverting input and at least one diode can be connected between the non-inverting input and a ground. The diode can be embodied as a diode connected MOS transistor. The input stage preferably comprises a PMOS differential pair to minimize noise.

The current integrator can consist essentially of a capacitor. The amplitude to time converter can comprises a comparator, where the comparator receives as inputs the integrated voltage and the predetermined voltage. A MOS transistor switch can be connected in parallel to the capacitor for discharging the capacitor when the transistor switch is turned on, wherein a gate of the transistor switch is coupled to an output of the comparator.

The system can comprise a transducer coupled to the amplifier, the transducer providing the time varying analog voltage signal. The system can provides at least 35 dB of gain throughout a frequency band ranging from 1 Hz to 1 kHz.

A method for processing data includes the steps of receiving an analog signal, and digitizing the analog signal into a pulse train, where a timing of pulses comprising the pulse train represents the analog signal. The analog signal can be generated by electrodes implanted inside a subject. The analog signal can be a neural signal.

The timing of the pulses can embed data for reconstructing the analog signal. In this embodiment, the method can further comprising the steps of transmitting the pulse train over the air to a remotely located receiver, and then reconstructing the analog signal from the pulse train.

The reconstructing step can comprise converting the pulse train to a train of impulse functions. In this embodiment, the method can further comprise the step of determining scalar weights for the impulse functions to form weighted impulse functions, where the weights are determined from timing information embedded in the pulse train. The weighted impulse function can be low pass filtered and then resampled at a uniform rate to recover a reconstructed version of the analog signal. An accuracy of the reconstruction can be at least 12 bits.

BRIEF DESCRIPTION OF THE DRAWINGS

A fuller understanding of the present invention and the features and benefits thereof will be obtained upon review of the following detailed description together with the accompanying drawings, in which.

DETAILED DESCRIPTION

Figure 1:
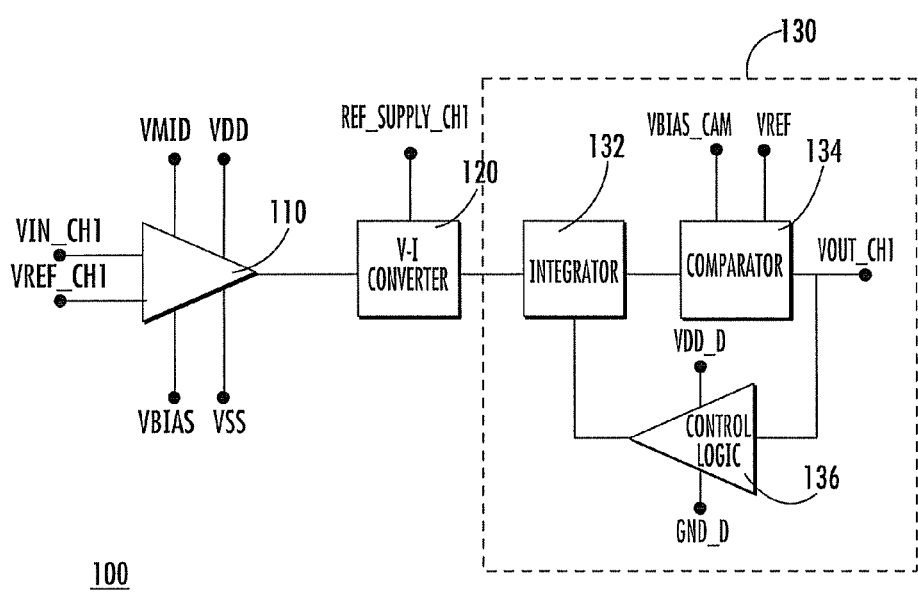
FIG. 1 is a high-level block diagram of an exemplary system according to the invention including an integrated amplifier/amplitude to time converter which provides a pulse coded output.

A fully-integrated CMOS amplifier with pulse outputs and a time to amplitude reconstruction algorithm to recover the analog signal converted into pulses by the amplifier is described. The system allows processing and recording of signals on the order of tens of microvolts, or less. These signals are amplified using a fully integrated preamplifier (hereafter generally referred to as an amplifier) which preferably provides at least about 40 dB of gain. The amplifier can reject the DC drift introduced at the electrode and electrolyte interface, but pass low frequency signals down to the mHz range without using any off-chip capacitors.

The amplified analog signals are transformed on the chip by a highly compact integrate-and-fire asynchronous voltage to time (V/T) converter. The overall circuit can be designed using a standard CMOS process, or using other processes, such as BiMOS, or even bipolar.

An amplifier-based system having pulsed output includes an amplifier for amplifying a time varying voltage signal to produce an output voltage signal. A voltage-to-current (V-I) converter converts the output voltage signal into a current signal. An output stage including a current integrator integrates the current signal to generate an integrated voltage. An amplitude to time converter generates a pulse train from the integrated voltage, where the timing of the pulses in the pulse train includes embedded information which represents the original time varying voltage signal. The pulse train representation permits transmission and accurate remote reconstruction of the original time varying voltage signal, such as signals generated by electrodes implanted inside a subject, for example, neural signals transmitted over the air. Simulations performed have demonstrated better than 12-bit precision can be achieved using the invention.

The invention provides a novel trade-off for the well-established level quantization analog-to-digital converters (ADCs). ADCs quantize analog signals into digital words which are readily read by digital computers. As noted in the background, problems with conventional ADCs include high expense, high power high consumption, and large circuit size.

The pulse train generated by the amplitude to time converter described herein relies on a simplified design at the front end (on-chip) and a more complex digital reconstruction process at the backend (off-chip). Specifically, analog voltages to be processed are embedded into the timing of pulses generated by the system using a very limited number of circuit elements, particular for the converter function. Therefore, the inventive system comprising an amplifier and V/T converter is nearly as small as the amplifier alone and an alternative to a conventional ADC. Such a tradeoff is well suited for low-power implanted bioinstrumentation systems, as well as many other applications dealing with distributed sensing. To reconstruct the value of the analog signal amplitude, some calculations are required, but the calculations can be performed at the receiver end, where a larger form factor is generally permitted and the associated devices can conveniently draw power from an AC outlet.

In a preferred embodiment of the invention, the analog output of the amplifier is translated to a pulse position representation using a silicon integrate-and-fire neuron. This arrangement provides a better noise immunity than transmitting an analog signal and also eliminates the need for a traditional ADC. The pulse train can be reconstructed to the original analog signal based on various known methods, such as the algorithm shown in FIG. 7 and described below.

FIG. 1 shows a high-level block diagram of various components comprising amplifier/V/T system 100. Due to the very small input signal amplitude provided in many applications, it is generally necessary to preamplify the signal (denoted Vin) prior to any processing. The first stage in system 100 is an amplifying stage comprising amplifier 110. Amplifier 110 preferably provides at least 35 dB of gain in the pass band. A voltage-to-current (V-I) converter 120 converts the output voltage signal into a current signal. Amplifier 110 together with V-I converter 120 functions as an operation transconductance amplifier (OTA), that being a voltage controlled current source.

An amplitude to time converter section 130 provides analog-digital pulse conversion, preferably using an integrate-and-fire neuron. Amplitude to time converter 130 is shown including current integrator 132 which integrates the current signal provided by V-I 120 to generate an integrated voltage. Comparator 134 together with control logic 136 generates a pulse train at the output of comparator 134 from the integrated voltage provided. The timing of the pulses in the pulse train represents the original time varying voltage signal. The pulse train representation permits transmission, such as over the air, and remote reconstruction of the original time varying voltage signal, such as from signals generated by electrodes implanted inside a subject, including neural signals.

Figure 2:
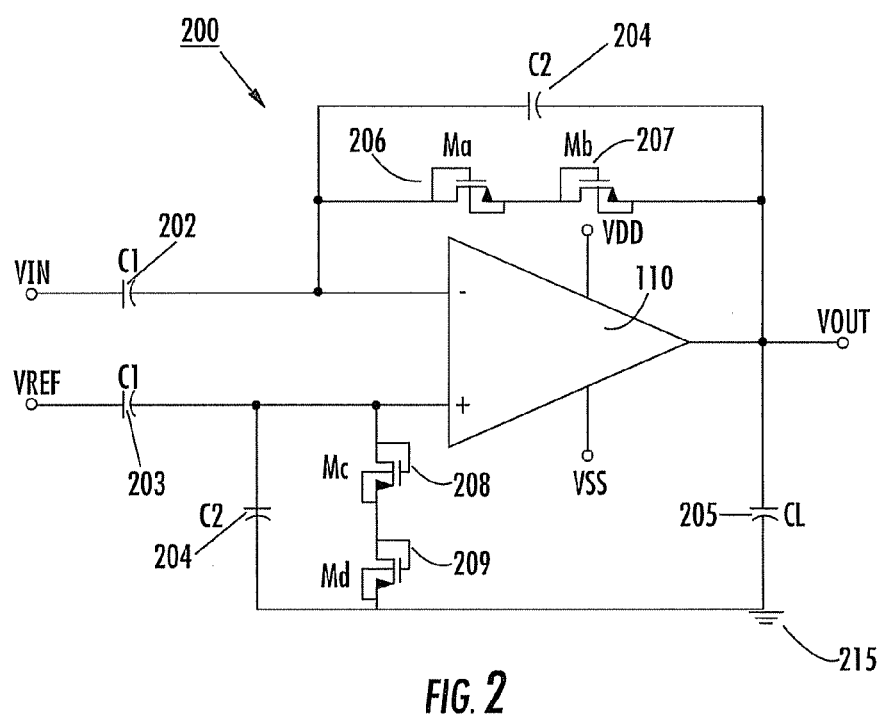
FIG. 2 is a schematic of an amplifier showing various on-chip components associated with the respective inputs and the output of the amplifier, according to an embodiment of the invention.

FIG. 2 is a schematic of an exemplary amplifier 200 showing various on-chip components associated with the respective inputs and the output of the amplifier, according to an embodiment of the invention. AC coupling provided by capacitors 202 and 203 is used to reject DC signals including the DC offset inherent in applications including BMI. A feedback capacitor $C_2$ (204) is shown disposed between the output of amplifier 110 and its inverting input, and a load capacitor $C_L$ (205) is disposed between the output of amplifier 110 and ground. The midband gain of amplifier 200 (Am) is set by the ratio of $C_1/C_2$. For the case when $C_1$, $C_L \gg C_2$, the bandwidth of amplifier 110 is approximately $g_m/(AmCL)$, where $g_m$ is the transconductance of amplifier 200.

Two (2) series connected diode connected PMOS transistors (206 and 207) are shown between the output of amplifier 200 and its inverting input. Two other diode connected PMOS transistors (208 and 209) are connected between the non-inverting input of amplifier 110 and the analog ground 215.

Figure 3:
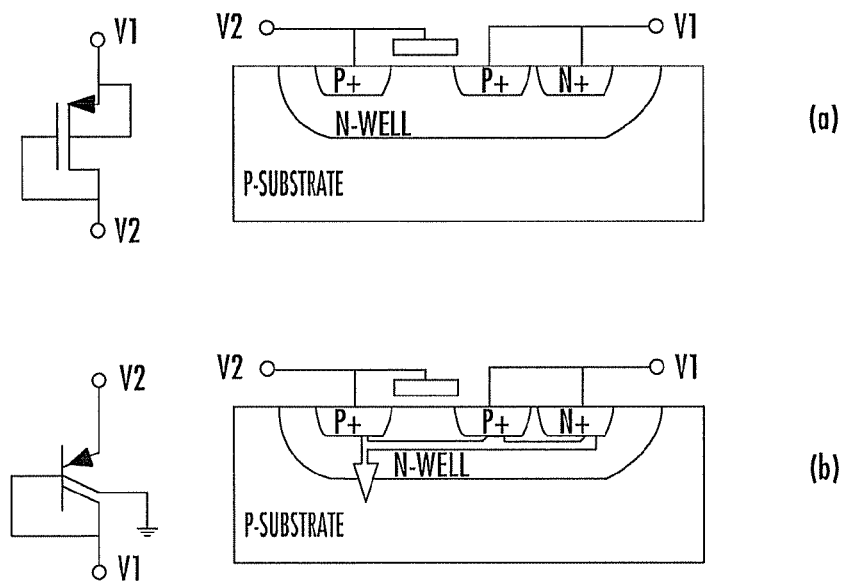
FIG. 3($a$) is a cross sectional view of a diode connected MOS transistor which functions as a pseudo resistor for small applied voltages, while FIG. 3($b$) shows its equivalent bipolar representation.

The lower cutoff frequency $\omega L$ at the AC coupled inputs is given by $1/(2r_p C_2)$, where $r_p$ is the small signal resistance of the series connected pseudo-resistors 208 and 209, which is equivalent to series connected pseudo resistors 206 and 207. FIGS. 3(a) and (b) demonstrates that the pseudo-resistor pairs function as a pair of diodes in parallel, with opposite polarity. FIG. 3(a) demonstrates that these components work like diode-connected PMOS transistors when V1>V2 while FIG. 3(b) shows when V2>V1 they work as a PNP transistor. Although the time constant for small signals is extremely long, a large voltage change at the input node will cause a large voltage drop across the pseudo resistors. Since the resistance of the pseudo-resistor decreases as the voltage drop increases, the time constant for the large input signal is reduced correspondingly.

Figure 4:
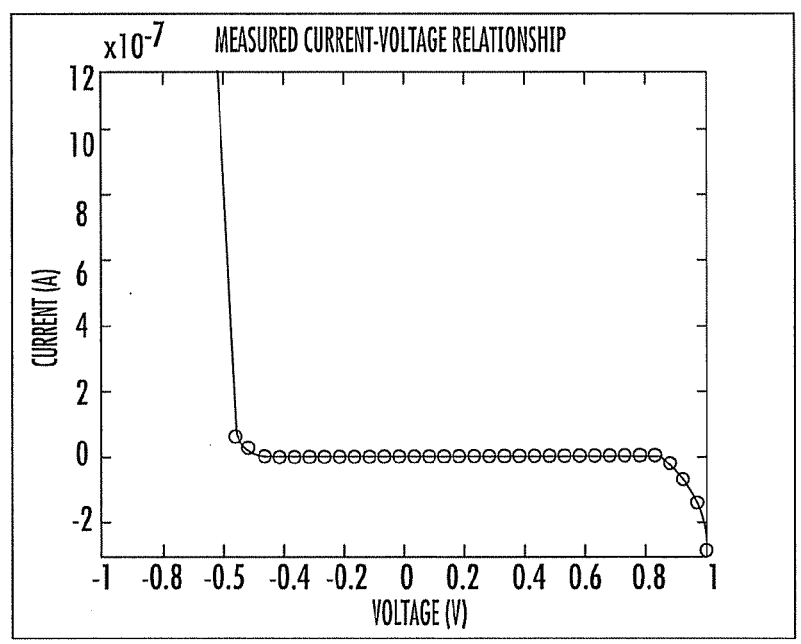
FIG. 4 shows a measured current-voltage relationship from an exemplary MOS pseudo-resistor.

The pseudo resistors 206-209 provide an I-V characteristic characterized by a current which increases exponentially with voltage for either sign of voltage and provide an extremely high equivalent resistance (dv/di) region around the origin. For $|\Delta V|<0.2$ V $dV/dI>10^{11}\Omega$ was measured. As shown in FIG. 4, the I-V relationship of the pseudo-resistors 206-209 provides an effective resistance which is large for small signals and very small for large signals. Two pseudo resistors in series 206/207, and 208/209 are used to provide a larger voltage range.

Figure 5:
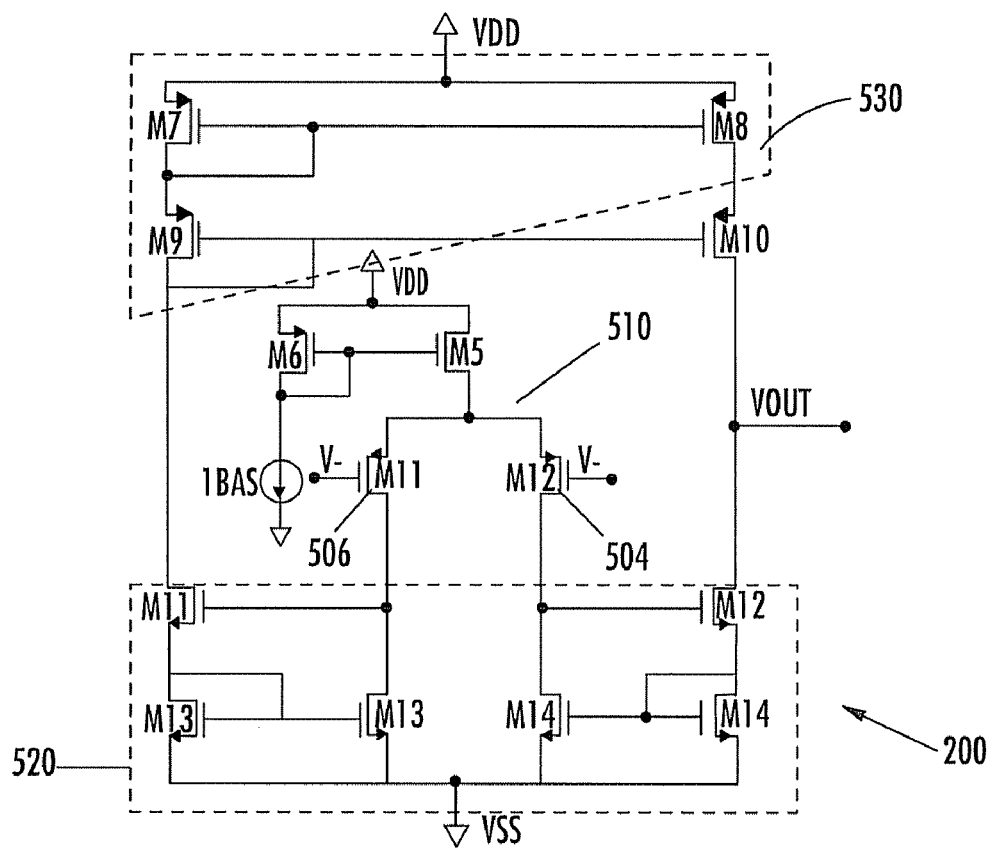
FIG. 5 is a circuit schematic for an exemplary low noise operational amplifier, according to an embodiment of the invention.

FIG. 5 is a circuit schematic for the exemplary low noise operational amplifier 200 shown in FIG. 2, according to an embodiment of the invention. Amplifier 200 is a standard two-stage CMOS amplifier with a p-type input differential pair operating from a +/−2.5V supply. In the first stage, input differential pair 510 comprising M1 (504) and M2 (506) is actively loaded by Wilson current mirrors 520 comprising M3, M4, M11, M12, M13 and M14. In the second stage, the output resistance of amplifier 200 is given by:

$$R_{out} = R_{out12} \| R_{out10} \quad (1)$$

where $\text{Rout}_{12}$ is the output resistance of cascode current mirror 530 comprising M7, M8, M9 and M10 and $\text{Rout}_{10}$ is the output resistance of the Wilson current mirror 520. Thus:

$$R_{out10} \approx T_{o8} \times T_{o10} \times gm8 \quad (2)$$

$$R_{out12} \approx T_{o12} \times T_{o14} \times gm14 \quad (3)$$

Although not shown, the second amplifier stage can be a cascode output which can improve the output swing while keeping the same output resistance. The disadvantage of using a second stage cascode output is the extra bias circuitry required.

One of the most pressing problems regarding preamplifier designs, particularly for biological amplifiers, is the noise performance of the first stage. In the low-frequency low-power applications, thermal noise and flicker noise also play important roles.

Although a very common two-stage amplifier structure is shown in FIG. 5, the thermal noise of amplifier 200 can be minimized by carefully choosing the W/L of the transistors. M9 through M12 in FIG. 5 are common gate transistors, thus, their thermal noise contribution can be neglected. The input differential pair M1 (506) and M2 (504) are designed to have identical sizes. Their transconductance is denoted as $gm_1$ and the ratio of width to length of the transistor (W/L) as (W/L) 1. The cascode current mirror transistors M7 and M8 are the designed to have the same size and their transconductance is denoted as $g_{m7}$ and their (W/L) as (W/L)7. The Wilson current mirror transistors M3, M4, M13 and M14 are also designed to have the same size and their transconductance is denoted as $gm_3$ and their (W/L) as (W/L)3. The input-referred thermal noise voltage can be calculated to be:

$$\overline{v_{ni,OTA}^2} = \left[\frac{16\kappa T}{3g_{m1}}\left(1 + 2\frac{g_{m3}}{g_{m1}} + \frac{g_{m7}}{g_{m1}}\right)\right]\Delta f \quad (4)$$

From Eq. 4, gm7, gm3 is preferably decreased and gm1 increased as much as possible in order to minimize the total input-referred thermal noise. The most straightforward method is to decrease $(W/L)_7$, $(W/L)_3$ or increase $(W/L)_1$. However, the size of M3 and M4 are related to the stability of amplifier 110, the 2nd-order poles of amplifier 200 shown being located at $\omega_{p2}=g_{m3}/C_3$, the capacitance seen by the gate of M3 (or M4). Similarly, there is a high-order pole located at the gate of M7. If the size of these transistors is decreased too much, the higher-order poles will dominate and decrease the phase margin eventually leading to stability problems. Consequently, there is generally a tradeoff between input referred thermal noise and stability.

Since flicker noise is inversely dependent on the WL product of the transistors, one approach to decrease flicker noise is to increase the device area. The size of the current mirrors transistors cannot generally be increased arbitrarily because of potential stability issues. Since the input is AC coupled, the amplifier input referred thermal noise can be derived as:

$$\overline{v_{ni,amp}^2} = \left(\frac{C1 + C2 + C_{in}}{C1}\right)^2 \overline{v_{ni,OTA}^2} \quad (5)$$

where $C_1$ and $C_2$ are shown in FIG. 2, and Cin is amplifiers input capacitance. From Eq. 5 and Eq. 4, the optimum size for M1 (506) and M2 (504) can be derived under the boundary conditions of minimum flicker noise and minimum total input referred noise.

PMOS devices are preferably used for the differential pair because PMOS generally exhibit less flicker noise than NMOS transistors because the former carry the holes in a buried channel", i.e. at some distance from the oxide-silicon interface. However, the invention can also use NMOS differential pair when noise is less of a concern and higher speed is desired.

Figure 6:
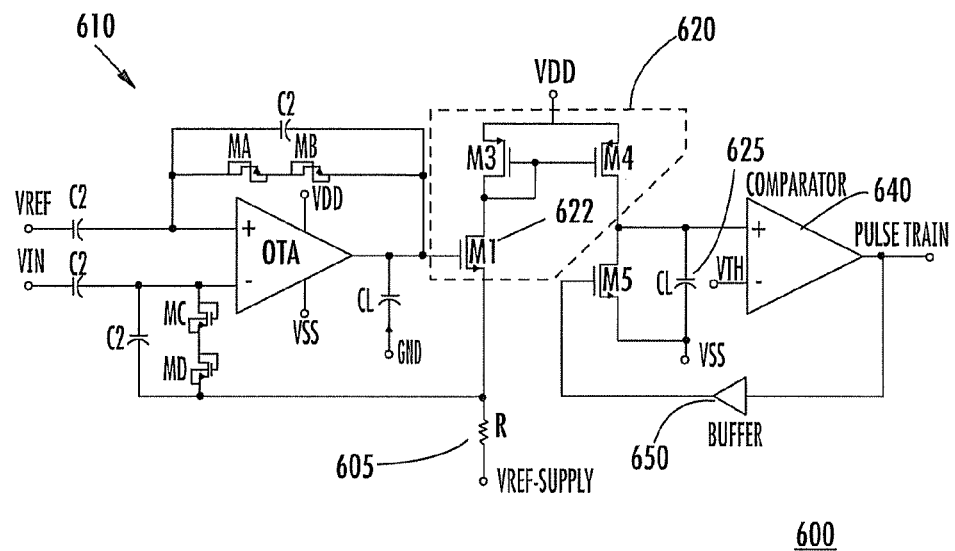
FIG. 6 is a circuit schematic for an exemplary system according to the invention including an integrated amplifier/amplitude to time converter which provides a pulse coded output.

FIG. 6 is a circuit schematic for an exemplary system 600 according to the invention including an integrated amplifier/amplitude to time converter which provides a pulse coded output. Compared with analog signals, digital signals are much more robust to transmission noise. In addition, digital signals are easily storable and provide for more advanced processing algorithms. The most popular class of A/D converter is currently the Nyquist-Rate converter which is loosely defined as those converters that generate a series of sampled output values which have a one-to-one correspondence to the sampled input voltages. However the resolution of the Nyquist-Rate converter is ultimately limited by the power supply. With the improvement of the submicron technologies, high resolution analog circuits are complicated by the reduced low-power supply and poor transistor output resistance, mainly caused by the body-effect. Δ-ΣA/D converters provide a solution to the above problems by relaxing the requirement on the analog circuitry at the expense of more complicated digital circuitry. The invention instead takes this approach one step further and uses simple analog circuitry as well a simple digital circuitry comprising an integrate-and-fire asynchronous mechanism in a preferred embodiment. For applications where signal reconstruction is required, the inventive design comes at the expense of a much more complicated reconstruction stage for the subsequent digital processor.

The V-I converter shown in system 600 comprises a single resistor 605 for converting the output voltage of amplifier 610 into a current. Fixed resistor 605 is used to preserve signal linearity. This current is mirrored by mirror 620 comprising M1, M3, and M4 and charges Ci (625) until the voltage across Ci (625) reaches Vth (a fixed voltage threshold) which is applied to one input of comparator 640, resulting in the output of comparator 640 going high. The high voltage at the output of comparator 640 through buffer 650 which includes two CMOS inverters, then opens the switch transistor M5 (635) which pulls the + input of comparator 640 down to ground very quickly. As a result, since the input to the + input of comparator 640 becomes <Vth, the output of the comparator 640 drops correspondingly, thus a pulse is completed. This cycle of charging Ci (625), pulling the output of comparator 640 high, turning on transistor 635, and pulling down the output of comparator 640 to complete individual pulses thus continues.

The width of the pulses generated by system 600 is primarily determined by the speed of the comparator 640 and the time delay through buffer 650. The equations below describe the relationship between the interval of two consecutive pulses (integration time) and the input:

$$v_{out,amp} = M_M v_{in} \quad (7)$$

Referring again to FIG. 6, M1 (622) works as a voltage follower and the voltage at the source of MI is approximately equal to the voltage at the output of amplifier 610.

$$i_i = (V_{ref\text{-}slp\ ply} - V_{mid} + V_{out,amp})/R \quad (8)$$

$$\int_k^{k+1} i_i / C_i dt = V_{th} \quad (9)$$

Substituting eq.(4), eq.(5) into eq.(6) the following results:

$$\int_k^{k+1}(V_{ref\text{-}sup\ ply} - V_{mid} + A_M v_{in})dt = V_{th} R C_i \quad (10)$$

if the input signal is bounded to a constant b and bandlimited to Ω. Thus, when $$V_{th} < \frac{(V_{ref\_supply} - V_{min} - bA_m)\pi}{RC_i\Omega}$$

the original signal can theoretically be reconstructed perfectly. As noted above, FIG. 7 shows an algorithm for reconstructing the continuous-time waveform given the neuron firing times.

Regarding layout details, the size of the transistors in the amplifier described herein are generally large. Proper layout methods should be employed to decrease the random mismatch. The amplifier is preferably a highly symmetric structure, with the corresponding current mirror and input pair using a common centroid structure. Since the gain of the amplifier 600 is determined by the ratio of the capacitors $C_2/C_1$, a large load capacitor $C_L$ is required to achieve a kHz level high-frequency cutoff. The area consumed by capacitors is dominant in the layout. Although poly-to-poly capacitors were used in the exemplary system simulated, other capacitor types including MOS capacitors can be used for processes that do not have a second-level poly available.

A major issue in mixed signal design is power supply ripple and this is one drawback that arises from using digital pulses on the same chip along with analog circuitry. The width of the pulses in the exemplary design was about 88 ns which could contaminate the power supply for the sensitive analog components. Since the pulses are asynchronous the problem is not as severe as in a standard clocked mixed-signal design.

Nonetheless, the preferred layout uses two separated power supplies for the digital and analog components. Furthermore, since in this process the digital ground and analog ground share the same substrate, a guard ring is included to decrease the interface noise through ground.

Figure 7:
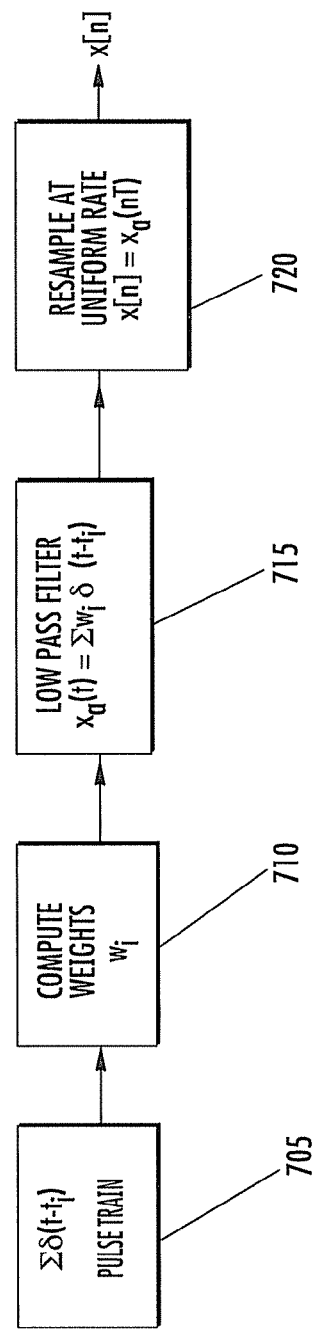
FIG. 7 is a block diagram showing steps in a digital reconstruction algorithm according to the invention which converts received pulse train positions which encode an analog single in the timing of the respective pulses into the analog signal.

At the receiving station, the pulse train is generally reconstructed back into the original amplitude (analog) signal. The methodology described herein capitalizes on the theory of aperiodic sampling to achieve time to amplitude conversion with high accuracy. FIG. 7 is a block diagram showing steps in an exemplary digital reconstruction algorithm 700 according to the invention which converts pulse positions which encode an analog single in the timing of the respective pulses back into the analog signal.

In step 705, a pulse train of impulse functions is generated from asynchronous digital pulses which in their timing encodes an analog signal X[n]. In step 710, scalar weights ($w_i$) are computed using the encoding information. In step 715, low pass filtering is performed on the weighted sum of the impulse functions to provide $X_a(t)$. In step 720, resampling is performed at a uniform rate to recover X[n]. An example of signal reconstruction from spiking neuron models: is demonstrated in the Examples.

Although the invention was developed primarily for the bioinstrumentation market, the invention can be applied to a much broader range of applications since the form factor, the power consumption and the price will be low. Regarding bioinstrumentation applications, the features provided by the amplifier/V/T system according to the invention to enable portable, low maintenance and distributed sensing.

For example, in the bioinstrumentation application it is generally necessary to amplify several hundred channels of data to monitor brain activity for brain machine interfaces (BMIs). The signals are typically in the sub microvolt range, and have a bandwidth of 100 to 6 kHz. The amplifiers should draw small current to be in operation for many months without recharging the batteries used to power the amplifier/V/T system. Moreover, the systems are preferably miniaturized because of the large number of sensors, and they should provide large signal to noise ratio for fidelity. The brain signals collected are analog but they need to be further processed by digital computers using digital signal processing algorithms. Typically, 12 bit ADC converters are needed (70 dB of dynamic range).

One application for the invention is a personal computer server that interfaces with a plurality of sensors, such as sensors implanted inside a subject. In the emerging brain machine interface market, the invention will enable portability and implantation under the skin, which has not been generally possible prior to the invention. Applied to a BMI or an analogous system which requires a plurality of small, low power amplifier/ADC circuits to process sensor data, the invention provides a new circuit that allows hundreds or thousands of the amplifier/V/T systems according to the invention to be placed on a single CMOS wafer since it is fully integrated (no external components are required), and as described in the Examples requires low-power (170 µW/channel) and is very compact (0.088 mm²/channel) for an exemplary 0.6 µm process. Thus, a 1000-channel neural recording system would consume only 170 mV and fit on a 9 mm×9 mm silicon die in the exemplary 0.6 µm process (excluding pads and package). This system is thus very promising in terms of its high resolution, multi-electrode, chronic neural recording applications. Although a wireless interface is not described herein, those having ordinary skill in the art will appreciate that a wireless interface including a transceiver, filters, and antenna(s) can also be included on chip along with the amplifier/V/T described herein.

EXAMPLES

It should be understood that the example and embodiments described herein are for illustrative purposes only and that various modifications or changes in light thereof will be suggested to persons skilled in the art and are to be included within the spirit and purview of this application. The invention can take other specific forms without departing from the spirit or essential attributes thereof.

Simulation results from a prototype one channel amplifier/V/T implantable neural recording system according to the invention is presented. An amplifier with pulse outputs using the AMI 0.6 µm 3-metal, 2-poly CMOS process available through MOSIS was designed (MOSIS Service, Marina del Rey, Calif.). The designed gain was 40 dB. Considering the parasitic and fringing effects, $C_1$ was set to 200 fF and thus $C_2$ to 20 pF to achieve the desired 40 dB of gain.

Both $C_1$ and $C_2$ were designed as poly to poly capacitors. One channel consumes 0.088 mm chip area, with most of the area used by the capacitors. R was set to 15 kΩ and designed with a long segment of lightly doped polysilicon. Since the average pulse width is about 60 ns, and frequency of digital output is pretty high compared to the low frequency analog signal. As mentioned above, a guard ring was designed to separate the digital ground and analog ground and two power supplies were employed to improve isolation of the digital circuitry from the analog circuitry.

Figure 8:
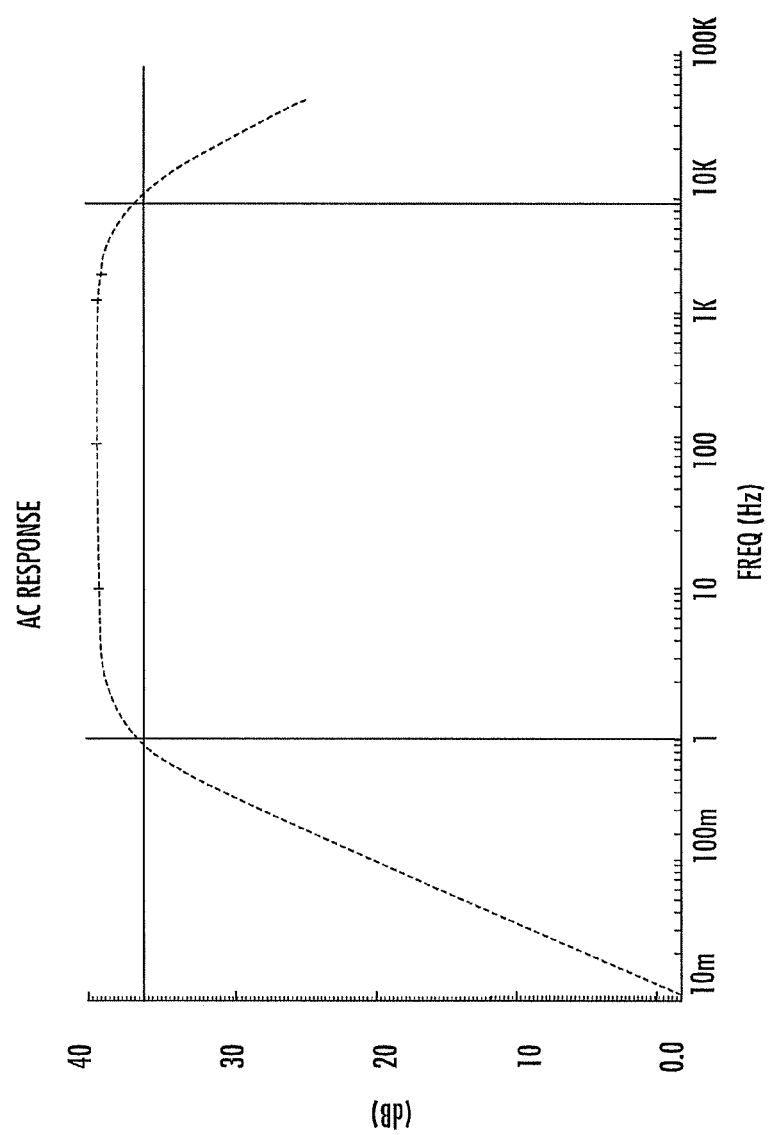
FIG. 8 shows the simulated frequency response for the amplifier shown in FIG. 2.

FIG. 8 shows the simulated frequency response of the amplifier described above.

The gain in the pass band dropped from the designed value of 40 dB to 39 dB likely because of parasitic capacitance. The lower −3 dB cutoff frequency is seen to be about 0.9 Hz, and higher cutoff frequency to be about 9 kHz.

Figure 9:
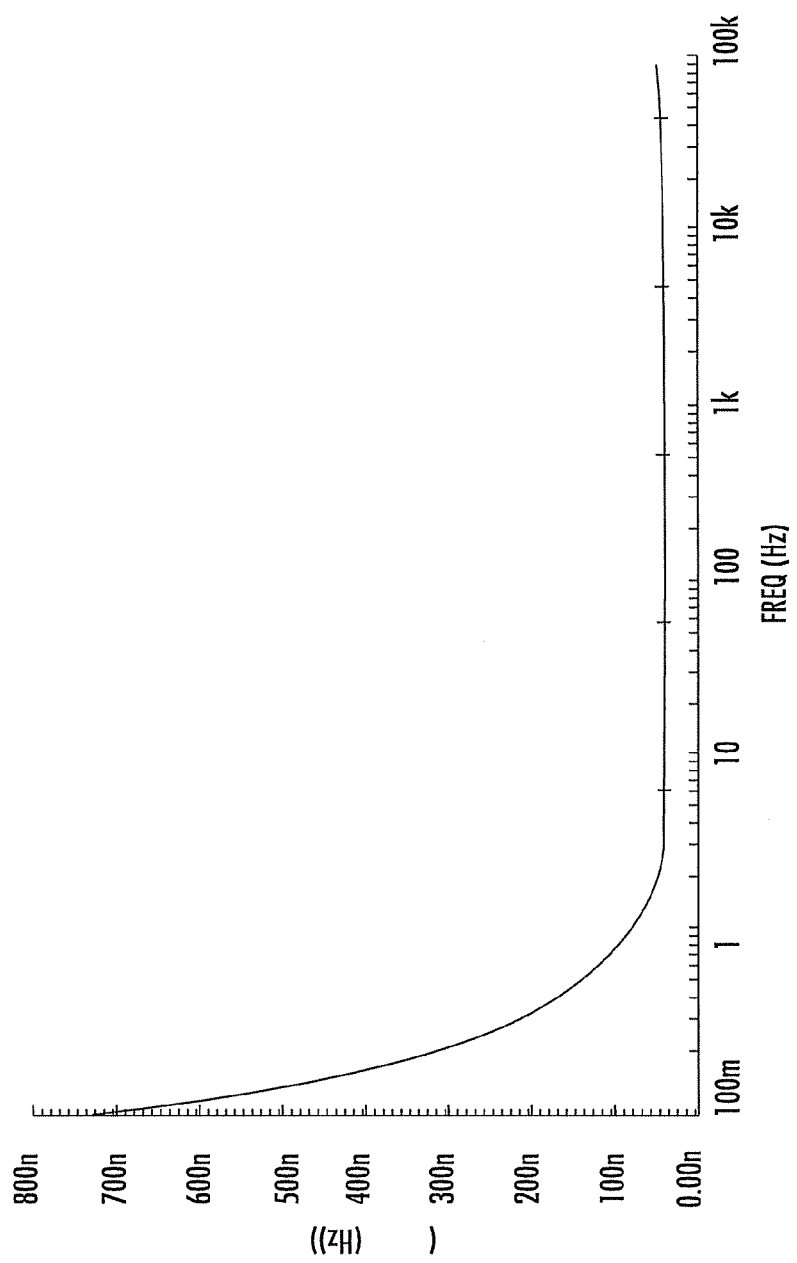
FIG. 9 is a plot of the simulated input referred noise voltage as a function of the log of frequency for the amplifier shown in FIG. 2.

FIG. 9 shows the input referred noise spectrum from the simulated amplifier/V/T. In the low-power and low-noise circuitry design field, the Noise Efficiency Factor (NEF) is generally used to quantify the trade off between noise, bandwidth and power:

$$NEF = V_{ni,rms} \sqrt{\frac{2I_{total}}{\pi U_T 4\kappa TBW}} \qquad (11)$$

where Vni;rms is the input rms noise, Itotal is the total supply current, and BW is the bandwidth in Hz. This definition is a normalized value with respect to the input referred thermal noise of a single bipolar transistor. The thermal noise level is 26 nV/(Hz)$^{1/2}$ and the 1/f noise corner frequency was about 10 Hz. The integration noise was 2.6 µVrms. The integration range was from 0.5 Hz to 15 kHz. The simulated NEF of this design shown in Table 1 below is very close to the NEF value reported by R. R. Harrison and R. Guerreri, in a paper entitled "A Low-power Low-noise CMOS Amplifier for Neural Recording Applications," IEEE J. Solid-State Circuits, vol. 38, pp. 958-965, June, 2003.

Table I summarizes the simulated characteristics of bio-amplifier.

| Parameter | Simulation Results |
|---|---|
| Supply voltage | 5 V |
| Supply current | 8 uA |
| Gain | 39 dB |
| Bandwidth | 9 kHz |
| Lower cutoff frequency | 0.9 Hz |
| Input referred noise | 2.57 µVrms |
| Noise efficiency factor | 4.1 |
| CMRR | 48 dB |
| PSRR | 50 dB |
| Area | 0.088 mm2 |

Figure 10:
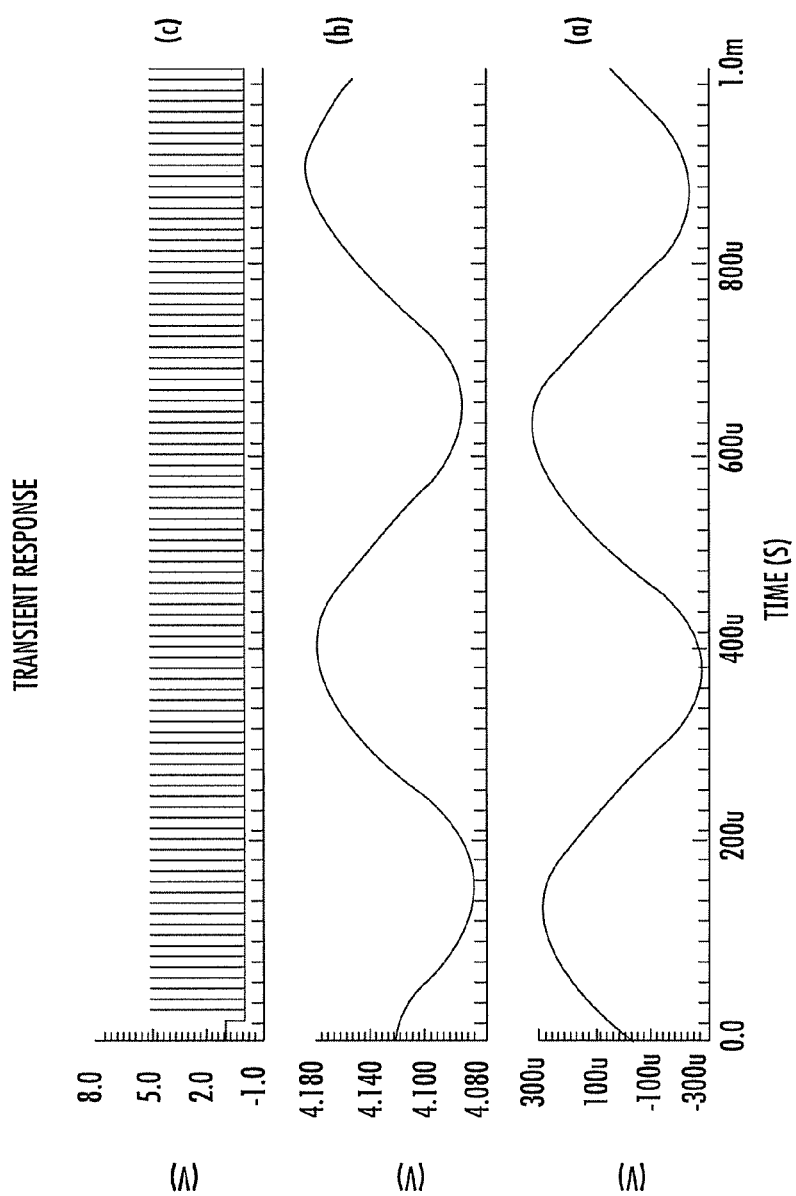
FIGS. 10($a$)-($c$) shows the transient response of an exemplary system according to the invention in response to a sine wave input, where FIG. 10($a$) shows the sinusoidal input signal, FIG. 10($b$) shows the output of the amplifier, and FIG. 10($c$) shows the resulting output pulse train.
Figure 11:
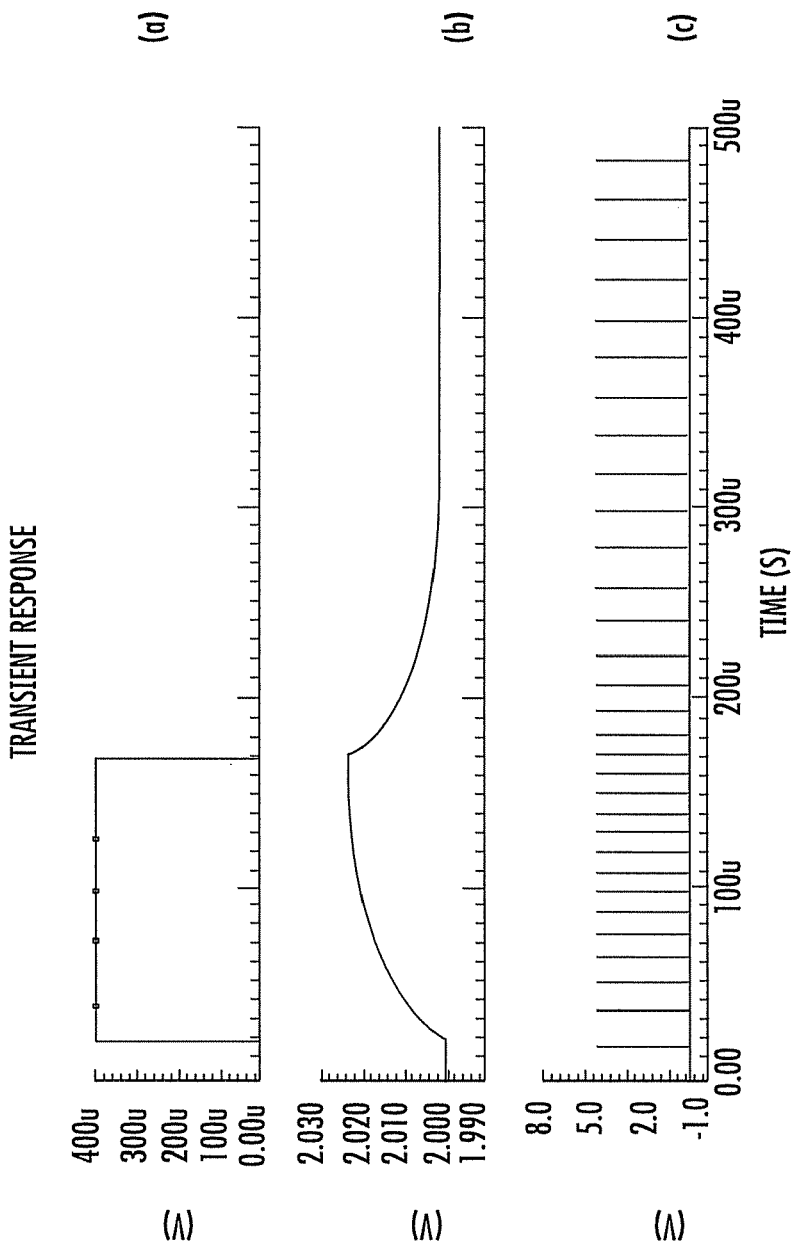
FIGS. 11 ($a$)-(c) shows the transient response of an exemplary system according to the invention to a pulse input, where FIG. 11 ($a$) shows the input pulse signal, FIG. 11 ($b$) shows the output of the amplifier, and FIG. 11 ($c$) shows the resulting output pulse train, respectively.

FIGS. 10(a)-(c) shows the transient response of an exemplary system according to the invention in response to a sine Wave input, where FIG. 10(a) shows the sinusoidal input signal, FIG. 10(b) shows the output of the amplifier, and FIG. 10(c) shows the resulting output pulse train. FIGS. 11(a)-(c) shows the transient response of an exemplary system according to the invention to an input pulse which mimics the spike produced by neurons, where FIG. 11(a) shows the input pulse signal, FIG. 11(b) shows the output of the amplifier, and FIG. 11(c) shows the resulting output pulse train, respectively.

Since the branch including R (605), M1(622) and M3 in FIG. 6 needs a bias current, even when the input is zero, there are pulses representing the bias current. The bias current is set by $V_{ref\_supply}$ and R as follows:

$$I_{bias,V-I} = (V_{ref_{supply}} - V_{mid})/R \tag{12}$$

the firing rate can be estimated under this DC current, and an off-chip DSP method can be used to cancel this DC current. Suppose the time interval between two consecutive pulses is $$\Delta t_{bias,V-I} = \frac{V_{th}}{C_i I_{bias,V-I}} = \frac{V_{th}R}{C_i(V_{ref\_supply} - V_{mid})} \tag{13}$$

Another way is expanding this structure to fully differential mode so that the DC bias current can be cancelled theoretically. The total power consumption of the whole system simulated Was 170.2 µW and the contribution of analog part being about 80 µW, and the contribution of digital buffer being about 90 µW. The width of the pulse was 88 ns which as noted above is adjustable by changing the speed of comparator and/or the delay of the buffer.

An example is now provided to demonstrate signal reconstruction from integrate-and-fire (IF) neuron signals according to a reconstruction algorithm based on the invention. In the IF model, the synaptic input x(t) is integrated until its value reaches the cell threshold θ. At this time ($t_i$) an action potential is created and the integration is reset to zero. The firing times must satisfy:

$$\int_{t_i}^{i+1} x(t)dt = \theta \tag{14}$$

It is assumed that x(t) is bandlimited to $[-\Omega_s, \Omega_s]$, and $t_i, i \in Z$ be a timing sequence with maximum adjacent interval $(t_{i+1} - t_i) < T$, where the Nyquist period $T = \pi/\Omega_s$. Any bandlimited signal can be expressed as a low-pass filtered version of an appropriately weighted sum of delayed impulse functions.

$$x(t) = h(t) * \sum_j w_j \delta(t - s_j) = \sum_j w_j h(t - s_j) \tag{15}$$

where $w_j$ are scalar weights, $s_j = (t_j + t_{j+1})/2$, h(t) is the impulse response of the low-pass filter and * denotes the convolution operator. The purpose of creating another timing sequence $s_j$ is to improve the reconstruction efficiency. The impulse response of the ideal low-pass filter is given by:

$$h(t) = \sin(\Omega_s t)/(\Omega_s t) \tag{16}$$

Non-ideal low-pass filters can also be used in practical applications if the resulting approximation error is tolerable for the particular intended application.

The signal recovery problem is now simplified as how to calculate the appropriate weights. If $s_j = jT$ is a uniform sampling sequence, standard sampling theory can be used to show that the impulse weight reduces to $w_j = x(s_j)$.

Generally, the weights need to be reconstructed using the encoding information. Substituting equation 15 into equation 14, the following is obtained:

$$\theta = \int_{t_i}^{i+1} x(t)dt = \int_{t_i}^{i+1} \sum_j w_j h(t - s_j) dt \tag{17}$$
$$= \sum_j w_j \int_{t_i}^{i+1} h(t - s_j) dt$$
$$= \sum_j w_j c_{ij}$$

where $c_{ij}$ are constants that can be numerically computed with:

$$c_{ij} = \int_{t_i}^{i+1} h(t - s_j) dt \tag{18}$$

The resulting set of linear equations is given by $C = \theta$ in matrix form. Unfortunately, C is usually ill-conditioned necessitating the use of a SVD-based pseudo-inverse conditioning technique, such as pinv in Matlab or other matrix regularization methods, to calculate the weight vector w $$W = C^+ \theta \tag{19}$$

Given appropriate weights, eq. 15 can be used to numerically calculate x(t) to within machine precision. A similar derivation can be derived for any spiking neuron model that uses simple integration and/or linear operators.

Figure 12:
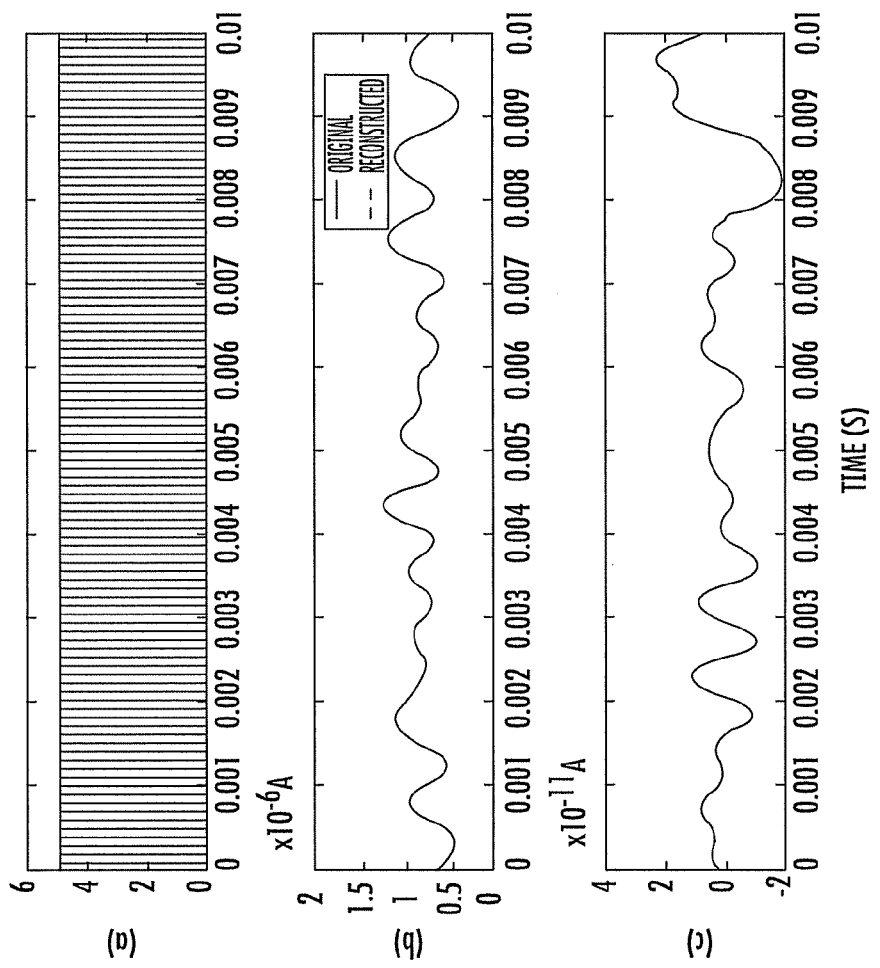
FIGS. 12($a$)-($c$) shows reconstruction results from an integrate-and-fire (IF) neuron including the original spike train, the original and reconstructed signals, and the error between the original and reconstructed signals, respectively.

FIG. 12 shows a reconstructed signal using this method for an integrate-and-fire neuron. The input signal is a Gaussian random noise signal bandlimited to [−3000π, 3000π], and the corresponding Nyquist period T=1/3 mS. Since the maximum adjacent spike interval (0.142 mS) is less than T, this method can be used to accurately reconstruct the input signal. The simulation results show the effective signal to noise ratio (SNR) of the reconstruction is 103.3 dB. SNR is computed as the power of the input signal divided by the power of the error between the original and the reconstructed signals.

Figure 13:
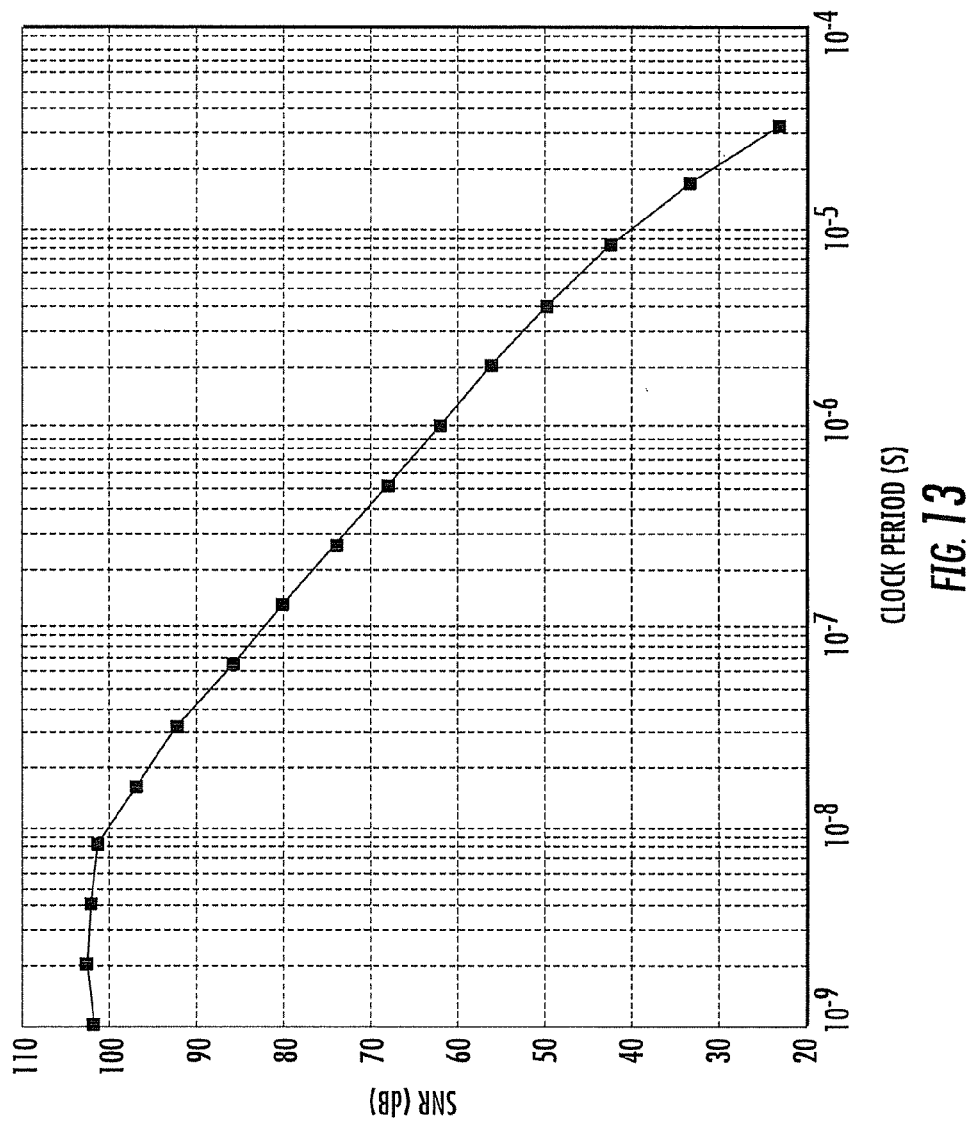
FIG. 13 is a plot of the SNR vs. clock period used in the reconstruction shown in FIG. 12.

For most practical applications, the spike train will be synchronized to a fast clock on a digital microprocessor or a DSP. This synchronization will necessarily introduce some time jitter to the recorded arrival time of each spike. FIG. 13 shows a plot of the SNR vs. the simulated clock period for the same random noise input used in FIG. 12. This plot indicates how fast the digital synchronization clock must run in order to achieve particular levels of performance. For example, if an SNR of 60 dB was desired then a clock period of 1 μS or less would be required, meaning a frequency of at least 1 MHz. The plot also gives an idea of how much jitter can be allowed in the timing signal in the electronics and in the transmission process. Uniform delays in all of the spikes results in a simple delay in the reconstructed signal so it is the variation among the delays that causes distortion.

Figure 14:
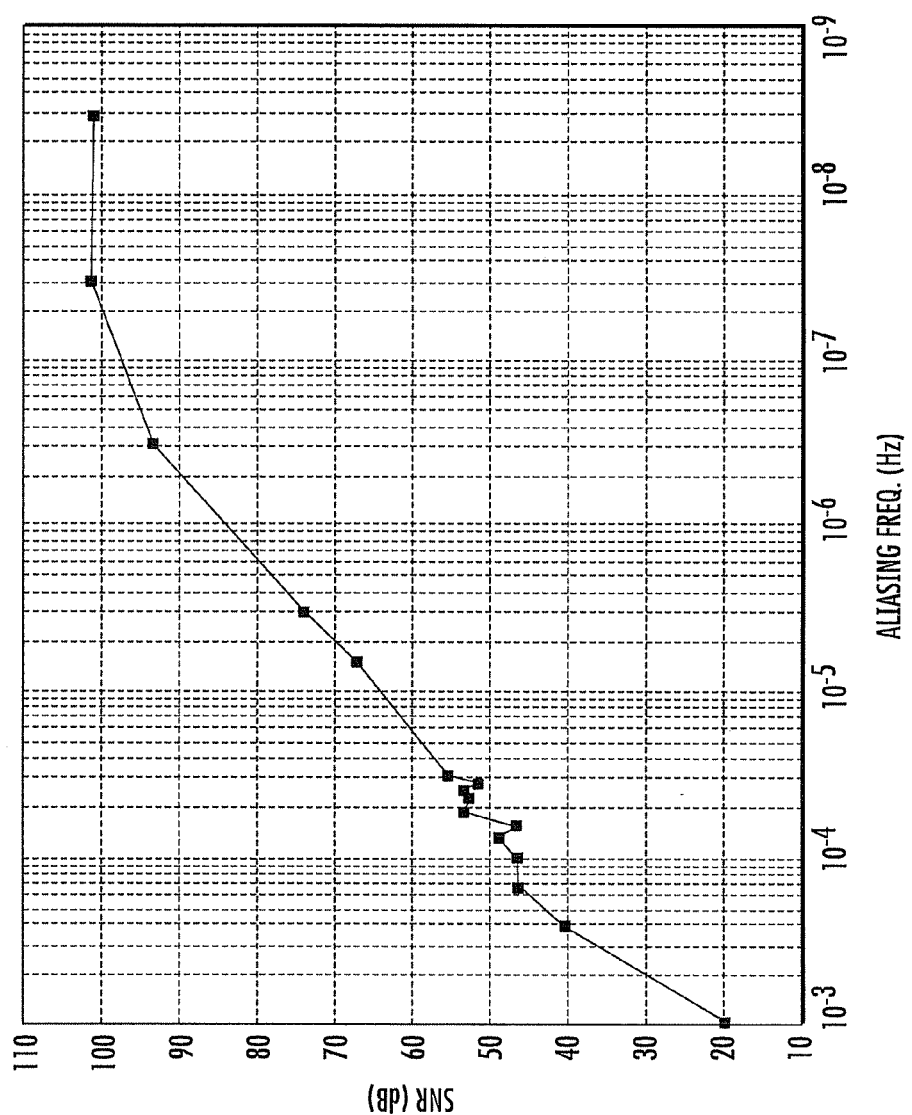
FIG. 14 is a plot of the SNR vs. aliasing frequency.

Since it is assumed that the input signal is bandlimited to some frequency, an anti-aliasing pre-filter is strictly required just as it is for standard Nyquist rate sampling. It is well known that for standard Nyquist rate sampling, higher frequencies are simply mapped to lower frequencies preserving the amount of energy. On the other hand, the integration step of the integrate-and-fire neuron provides an attenuation of these higher frequencies so that they cause less corruption of the reconstructed signal. FIG. 14 shows a plot of SNR vs. the frequency of an added high-frequency sine wave. As the frequency of the added sine wave increases, its detrimental effect is seen to be reduced.

It is to be understood that while the invention has been described in conjunction with the preferred specific embodiments thereof, that the foregoing description as well as the examples which follow are intended to illustrate and not limit the scope of the invention. Other aspects, advantages and modifications within the scope of the invention will be apparent to those skilled in the art to which the invention pertains.

We claim:

1. An amplifier-based system having pulsed output, comprising:
   an amplifier means for amplifying a time varying neural voltage signal, said amplifier means providing an output voltage signal;
   a voltage to current (V-I) converter, said (V-I) converter converting said output voltage signal into a current signal, and
   an output stage including a current integrator for integrating said current signal to produce an integrated voltage without sampling the current signal, and an amplitude to time converter for generating a pulse train defined by a sequence of pulses generated at varying time intervals, wherein time intervals between the pulses vary based upon said time varying voltage signal such that said pulse train represents said time varying voltage signal as a set of non-uniform time instances such that the integrated voltage between any two adjacent non-uniform time instances of the time-varying voltage signal is approximately equal to a constant.

2. The system of claim 1, wherein each pulse of said pulse train is initiated with a constant height and width at a time varying interval when said integrated voltage reaches a predetermined voltage related to the constant.

3. The system of claim 1, wherein said (V-I) converter comprises a fixed resistor.

4. The system of claim 1, wherein said amplifier means is a closed loop operational amplifier having an input stage including an inverting input and a non-inverting input.

5. The system of claim 4, wherein at least one diode is connected between an output of said operational amplifier and said inverting input and at least one diode is connected between said non-inverting input and a ground.

6. The system of claim 5, wherein said diode comprises a diode connected MOS transistor.

7. The system of claim 4, wherein said input stage comprises a PMOS differential pair.

8. The system of claim 1, wherein said current integrator comprises a capacitor.

9. The system of claim 8, wherein said amplitude to time converter comprises a comparator, wherein said comparator receives as inputs said integrated voltage and said predetermined voltage.

10. The system of claim 9, further comprising a MOS transistor switch connected in parallel to said capacitor for discharging said capacitor when said transistor switch is turned on, wherein a gate of said transistor switch is coupled to an output of said comparator.

11. The system of claim 1, further comprising a transducer coupled to said amplifier, wherein said transducer provides said time varying analog voltage signal.

12. The system of claim 1, wherein said system provides at least 35 dB of gain throughout a frequency band from 1 Hz to 1 kHz.

13. A system comprising:
   a signal-conversion portion for generating a pulse train defined by a sequence of pulses generated at varying time intervals based upon a time-varying voltage signal, said signal-conversion portion having
      an amplifier for amplifying the time varying voltage signal, said amplifier providing an output voltage signal,
      a voltage-to-current converter, said converter converting said output voltage signal into a current signal, and
      an output stage including a current integrator for integrating said current signal to produce an integrated voltage, and an amplitude-to-time converter for generating said pulse train defined by the sequence of pulses generated at varying time intervals, wherein time intervals between the pulses vary based upon said time varying voltage signal such that said pulse train represents said time varying voltage signal; and
   a signal-reconstruction portion in communication with said signal-conversion portion for receiving said pulse train and reconstructing said time-varying voltage signal based upon said pulse train, said signal-reconstruction portion configured to generate a plurality of impulse functions based upon said pulse train, to determine a plurality of weights based upon recorded values of the time intervals between successive pulses, to generate a plurality of weighted impulse functions based upon the determined weights, to filter the weighted impulse functions using a low pass filter, and to sample an output of the low pass filter at a uniform rate to recover a reconstructed version of said time-varying voltage signal.

14. A system to produce asynchronous pulsed output suitable for use in bioinstrumentation, comprising:
   an integrate-and-fire asynchronous voltage-to-time (V/T) converter, said (V/T) converter converting a time-varying analog neural signal captured by an electrode into the asynchronous pulsed output, the V/T converter comprising:
      an integrator comprising a capacitor to integrate said time varying analog neural signal to produce an integrated voltage without sampling the time varying analog neural signal; and
      a comparator receiving as inputs said integrated voltage and a predetermined voltage to generate a pulse of the asynchronous pulse output upon determining that the integrated voltage reaches the predetermined voltage, wherein the asynchronous pulse train is defined by a sequence of pulses generated at varying time intervals, wherein time intervals between the pulses vary based upon said time varying analog neural signal such that said pulse train represents the time-varying analog neural signal as a set of non-uniform time instances such that the integrated voltage between any two adjacent non-uniform time instances of the time-varying voltage signal is approximately equal to a constant.

* * * * *